United States Patent
Fukuda et al.

(10) Patent No.: US 9,585,276 B2
(45) Date of Patent: Feb. 28, 2017

(54) ELECTRICAL PART, NONAQUEOUS ELECTROLYTE CELL, AND LEAD WIRE AND SEALABLE CONTAINER FOR USE THEREIN

(75) Inventors: Yutaka Fukuda, Osaka (JP); Hiroshi Hayami, Osaka (JP); Hiroyasu Sugiyama, Kanuma (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 646 days.

(21) Appl. No.: 13/806,412

(22) PCT Filed: Feb. 28, 2012

(86) PCT No.: PCT/JP2012/054854
§ 371 (c)(1),
(2), (4) Date: Dec. 21, 2012

(87) PCT Pub. No.: WO2012/121051
PCT Pub. Date: Sep. 13, 2012

(65) Prior Publication Data
US 2013/0095375 A1    Apr. 18, 2013

(30) Foreign Application Priority Data
Mar. 4, 2011    (JP) ................................. 2011-048122

(51) Int. Cl.
*H05K 5/06* (2006.01)
*H01B 1/02* (2006.01)
(Continued)

(52) U.S. Cl.
CPC .............. *H05K 5/069* (2013.01); *H01B 1/02* (2013.01); *H01G 9/15* (2013.01); *H01M 2/021* (2013.01);
(Continued)

(58) Field of Classification Search
CPC .......... H01M 2/06; H01M 2/08; H01M 2/021; H01M 2/0275; H01M 2/0287; H05K 5/069
USPC ........................................................ 429/179
See application file for complete search history.

(56) References Cited

U.S. PATENT DOCUMENTS

2002/0146621 A1    10/2002    Yageta et al.
2005/0112461 A1    5/2005    Amine et al.

FOREIGN PATENT DOCUMENTS

CN    1369922 A    9/2002
JP    3562129 B2    6/2004
(Continued)

OTHER PUBLICATIONS

English translation of "High-Performance Antirust Pigment Aluminum Tripolyphosphate" cited in IDS, obtained Aug. 4, 2015.*
(Continued)

*Primary Examiner* — Nicholas P D'Aniello
(74) *Attorney, Agent, or Firm* — Global IP Counselors, LLP

(57) ABSTRACT

Provided is an electrical part, a nonaqueous electrolyte cell, and a lead wire and a sealable container for use therein, with which the adhesive property and sealing performance in an initial state and in an electrolyte-contacting state are enhanced. An electrical part includes a sealable container that includes a metal layer and a lead conductor that extends from inside of the sealable container to outside of the sealable container, the sealable container and the lead conductor being heat-sealed in a seal part. At least in part of the seal part, a thermal adhesive layer containing aluminum polyphosphate is provided in a portion between the metal layer and the lead conductor so as to be in contact with the lead conductor.

4 Claims, 3 Drawing Sheets

(51) Int. Cl.
*H01G 9/15*  (2006.01)
*H01M 2/06*  (2006.01)
*H01M 2/08*  (2006.01)
*H01M 2/02*  (2006.01)
*H01M 10/05*  (2010.01)

(52) U.S. Cl.
CPC ....... *H01M 2/0275* (2013.01); *H01M 2/0287* (2013.01); *H01M 2/06* (2013.01); *H01M 2/08* (2013.01); *H01M 10/05* (2013.01)

(56) References Cited

FOREIGN PATENT DOCUMENTS

| | | |
|---|---|---|
| JP | 2005-174825 A | 6/2005 |
| JP | 2008-210777 A | 9/2008 |
| JP | 2009-99527 A | 5/2009 |
| JP | 2010-33888 A | 2/2010 |
| JP | 2010-92631 A | 4/2010 |
| TW | 200843160 A | 11/2008 |

OTHER PUBLICATIONS

Notification for the Opinion of Examination dated Apr. 17, 2015 from the Taiwanese Patent Office to corresponding Taiwanese Patent Application No. 101106683.
Chinese Office Action of the corresponding Chinese Patent Application No. 201280001899.8, dated Jul. 23, 2014.
Cai Yun, "Aluminum tripolyphosphate as a high performance antirust pigment," China Coatings Journal, 22 (5), pp. 19-22, May 31, 2007, China.

\* cited by examiner

ELECTRICAL PART, NONAQUEOUS ELECTROLYTE CELL, AND LEAD WIRE AND SEALABLE CONTAINER FOR USE THEREIN

CROSS-REFERENCE TO RELATED APPLICATIONS

This U.S. National stage application claims priority under 35 U.S.C. §119(a) to Japanese Patent Application No. 2011-048122, filed in Japan on Mar. 4, 2011, the entire contents of which are hereby incorporated herein by reference.

TECHNICAL FIELD

The present invention relates to an electrical part used as a power source of small-sized electronic appliances or the like, a nonaqueous electrolyte cell such as a lithium ion secondary cell, and a lead wire and a sealable container which are constituent parts of the electrical part or the nonaqueous electrolyte cell.

BACKGROUND ART

With reduction in size and weight of electronic appliances, electrical parts such as batteries and capacitors used in these appliances are also desired to achieve size and weight reduction. Thus, for example, nonaqueous electrolyte cells that use a bag as a sealable container in which a nonaqueous electrolyte (electrolytic solution), a positive electrode, and a negative electrode are sealed have been employed. An electrolytic solution prepared by dissolving a fluorine-containing lithium salt, such as $LiPF_6$ or $LiBF_4$, in a nonaqueous organic solvent such as propylene carbonate, ethylene carbonate, dimethyl carbonate, or ethylene methyl carbonate, has been used as the nonaqueous electrolyte.

The sealable container is required to prevent penetration of electrolytic solutions and gas and entry of moisture from outside and thus a container having a bag shape formed by heat-sealing laminating films each including a metal layer such as an aluminum foil coated with resin has been used as the sealable container.

One end of the sealable container is formed as an open portion. Lead conductors that are connected to one end of a positive electrode plate and one end of a negative electrode plate sealed in the container are arranged to extend from the inside of the sealable container to the outside of the sealable container through the open portion. The open portion is heat-sealed to bond the sealable container and the lead conductors and to thereby seal the open portion. This portion to be heat-sealed last is referred to as a "seal part".

In the seal part, the sealable container and the lead conductors are bonded (heat-sealed) by using a thermal adhesive layer. The thermal adhesive layer is formed in advance on the lead conductor in a portion corresponding to the seal part in some cases or on the sealable container in a portion corresponding to the seal part in other cases. In either case, the seal part is required to maintain sealing property (sealing performance) without causing short-circuiting between the metal layer and the lead conductor.

PTL 1 discloses a battery sealing bag and a lead wire for use in such a nonaqueous electrolyte cell and describes that the sealing performance of the seal part can be enhanced by using a thermal adhesive layer formed by forming a maleic acid modified polyolefin layer directly on the conductor of the lead conductor.

However, although the adhesive property immediately after sealing is sufficient, moisture that has penetrated the seal part reacts with the electrolyte sealed inside the sealable container with long-term use, hydrofluoric acid is generated and corrodes the lead conductor (metal), and separation ultimately occurs at the interface with the metal layer or the lead conductor.

PTL 2 discloses a seal part that remains uncorroded despite generation of hydrofluoric acid due to the reaction between the electrolyte and moisture and maintains the adhesive property. In particular, PTL 2 discloses a battery tab constituted by a lead conductor having a nickel surface and a composite coating layer composed of an aminated phenol polymer, a trivalent chromium compound, and a phosphorus compound and covering the surfaces and the side surfaces of the lead conductor. PTL 2 describes that the composite coating layer prevents elution of the nickel layer and corrosion of the nickel layer caused by hydrofluoric acid generated from the electrolyte and moisture.

PTL 3 proposes forming a layer composed of an acid modified styrene-based elastomer in a seal part in a portion that comes into contact with the lead conductor.

CITATION LIST

Patent Literature

PTL 1: Japanese Patent No. 3562129
PTL 2: Japanese Unexamined Patent Application Publication No. 2009-99527
PTL 3: Japanese Unexamined Patent Application Publication No. 2010-92631

SUMMARY OF INVENTION

Technical Problem

The method disclosed in PTL 2 is not environmentally preferable since a heavy metal, chromium is used. According to the method disclosed in PTL 3, ethylene carbonate and diethyl carbonate were mixed at a 1:1 volume ratio and a lead conductor was left to stand still in a 80° C. thermostat for 4 weeks while being immersed in an electrolyte having a $LiPF_6$ concentration of 1.0 mol/L so as to evaluate separation as the electrolyte resistance. However, in recent years, electrical parts and the like used in automobiles are required to achieve long-term durability and thus further improvements of electrolyte resistance of the seal part have become an issue.

The present invention has been made to address these problems and an object thereof is to provide an electrical part that has enhanced sealing performance and enhanced electrolyte resistance at the seal part, a nonaqueous electrolyte cell, and a lead conductor and a sealable container for use therein.

Solution to Problem

An electrical part according to the present invention includes a sealable container that includes a metal layer and a lead conductor that extends from inside of the sealable container to outside of the sealable container, the sealable container and the lead conductor being heat-sealed in a seal part, in which, at least in part of the seal part, a thermal adhesive layer containing aluminum polyphosphate is provided in a portion between the metal layer and the lead conductor so as to be in contact with the lead conductor.

The thermal adhesive layer is preferably composed of a resin composition containing 1 to 33 parts by mass of aluminum polyphosphate per 100 parts by mass of an acid modified polyolefin. The aluminum polyphosphate preferably has an average particle diameter of 0.1 to 10 µm.

A nonaqueous electrolyte cell according to the present invention includes a sealable container that includes a metal layer, a lead conductor that extends from inside of the sealable container to outside of the sealable container, a nonaqueous electrolyte sealed inside the sealable container, and an electrode sealed inside the sealable container and connected to an end of the lead conductor, the sealable container and the lead conductor being heat-sealed in a seal part, in which, at least in part of the seal part, a thermal adhesive layer containing aluminum polyphosphate is provided in a portion between the metal layer and the lead conductor so as to be in contact with the lead conductor.

A lead wire according to the present invention is for use in the electrical part or the nonaqueous electrolyte cell described above, and includes a lead conductor and a thermal adhesive layer that covers the lead conductor at least in a portion corresponding to the seal part and that is in contact with the lead conductor, the thermal adhesive layer containing aluminum polyphosphate.

The lead conductor is preferably composed of nickel or a metal having a surface plated with nickel.

A sealable container according to the present invention is for use in the electrical part or nonaqueous electrolyte cell described above, and includes a metal layer and a thermal adhesive layer that covers the metal layer at least in a portion corresponding to the seal part, in which a portion of the thermal adhesive layer that comes into contact with the lead conductor contains aluminum polyphosphate.

Advantageous Effects of Invention

According to the present invention, since the thermal adhesive layer constituting the seal part has excellent resistance to hydrofluoric acid, an electrical part having a seal part with excellent electrolyte resistance, a nonaqueous electrolyte cell, and a lead wire and a sealable container for use in the electrical part and the nonaqueous electrolyte cell can be provided.

DESCRIPTION OF EMBODIMENTS

Embodiments of the electrical part according to the present invention will now be described with reference to FIGS. 1 and 2.

Figure 1:
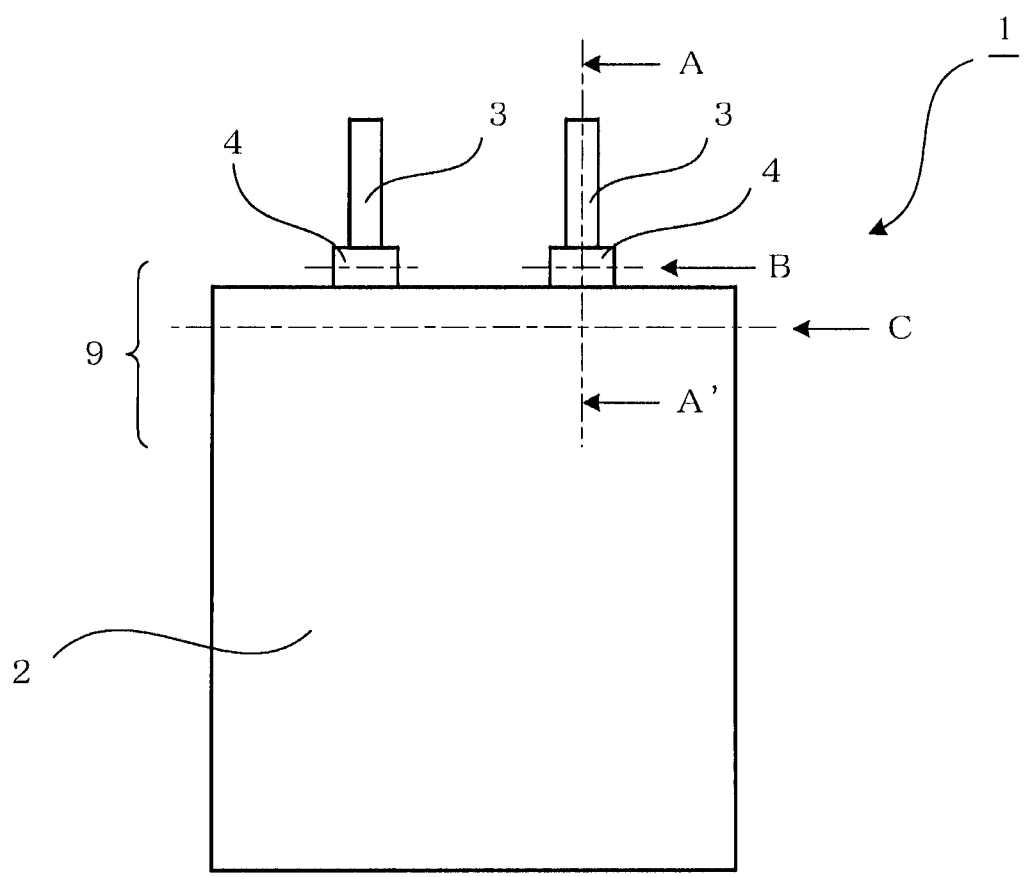
FIG. 1 is a front view of a nonaqueous electrolyte cell according to one embodiment of the present invention.
Figure 2:
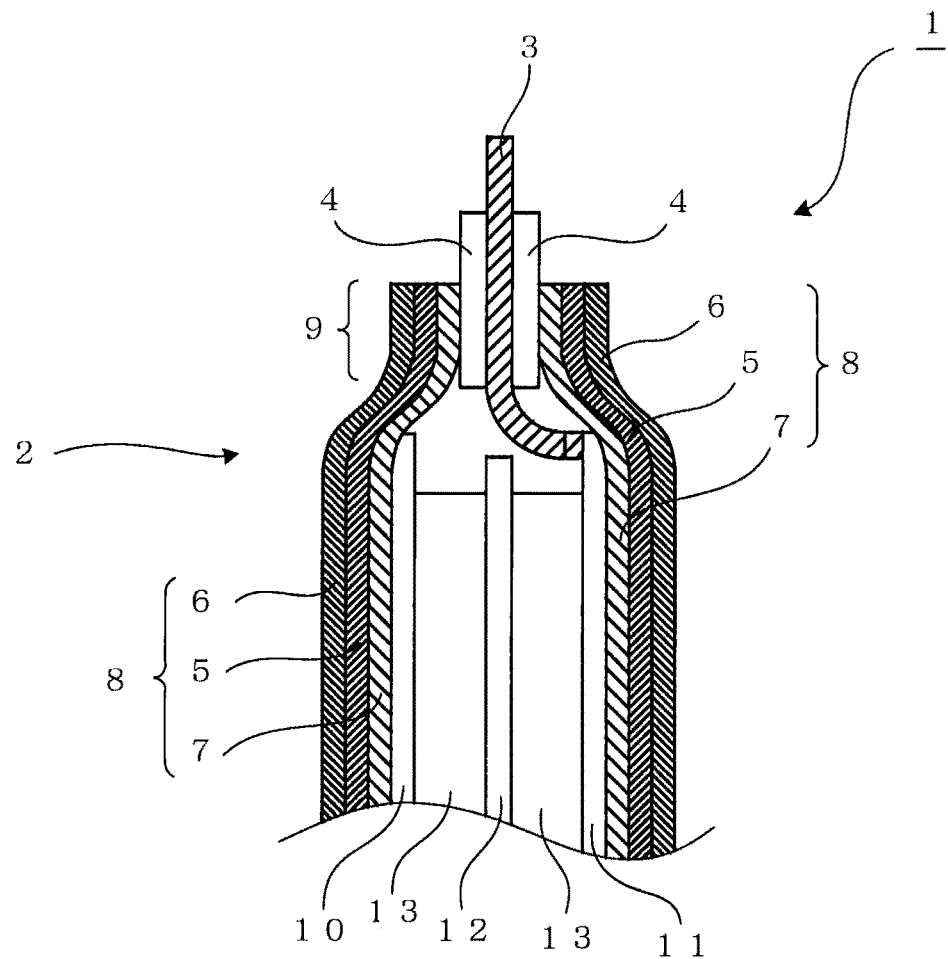
FIG. 2 is a partial cross-sectional view of a nonaqueous electrolyte cell according to an embodiment of the present invention.

FIG. 1 is a schematic front view of an embodiment of a nonaqueous electrolyte cell such as a lithium ion cell and FIG. 2 is a partial cross-sectional view taken along line A-A' in FIG. 1.

A nonaqueous electrolyte cell 1 shown in FIG. 1 includes a substantially rectangular sealable container 2 and lead conductors 3 that extend from inside of the sealable container 2 to outside.

As shown in FIG. 2, the sealable container 2 is a bag formed by superposing two three-layer laminating films 8 each constituted by a metal layer 5 and resin layers 6 and 7 coating the metal layer 5 and bonding the resin layers 7 by heat-sealing or the like along three sides (periphery) other than the side where the lead conductors 3 penetrate.

A positive electrode collector 10 and a negative electrode collector 11 connected to ends of the lead conductors 3, a nonaqueous electrolyte 13, and a separator 12 are sealed inside the sealable container 2.

A metal such as aluminum, nickel, copper, or nickel-plated copper is used as the lead conductors 3. In the case of lithium ion cells, aluminum is frequently used in the positive electrode and nickel or nickel-plated copper is frequently used in the negative electrode.

The laminating films 8 constituting the sealable container 2 use an aluminum foil or the like as the metal layer 5 and a polyamide resin such as 6,6-nylon or 6-nylon, a polyester resin, a polyimide resin, or the like as the resin layer 6 located on the outer side of the sealable container 2. An insulating resin that does not dissolve in the nonaqueous electrolyte and melts under heating is preferably used in the resin layer 7 located on the inner side of the sealable container 2. Examples thereof include polyolefin-based resins, acid modified polyolefin-based resins, and acid modified styrene-based elastomers.

The sealable container 2 is sealed through bonding (heat seal) between the lead conductors 3 that extend from inside of the sealable container 2 to outside and the sealable container (laminating films 8) with a thermal adhesive layer 4 therebetween. A feature of the present invention is that a resin that contains aluminum polyphosphate is used in the thermal adhesive layer 4 in this seal part 9.

The base resin constituting the thermal adhesive layer 4 may be any resin that melts by the heat during heat sealing and that can bond the sealable container 2 to the lead conductors 3. Examples thereof include polyolefin-based resins and acid modified styrene-based elastomers. Examples of the polyolefin-based resins include polyethylene, polypropylene, ionomer resins, and acid modified polyolefin. In particular, an acid modified polyolefin that has a bonding functional group and that is modified by maleic acid, acrylic acid, methacrylic acid, maleic anhydride, or the like is preferable. Among these, a maleic anhydride-modified polyolefin resin has an excellent adhesive property to the metal and excellent sealing property.

Aluminum polyphosphates are phosphates produced by polymerization of two or more $PO_4$ tetrahedrons by sharing oxygen atoms and examples thereof according to the degree of polymerization include aluminum polyphosphates having a linear structure such as aluminum triphosphate and aluminum tetraphosphate; cyclic or long-chain aluminum metaphosphates; and aluminum ultraphosphates in which linear and cyclic structures are linked with one another. Aluminum polyphosphates are powder sparingly soluble in water and are layered compounds in which sheet-shaped crystals are stacked. Aluminum polyphosphates may contain crystalline water or may be anhydrides.

The average particle diameter of the aluminum polyphosphate used in the present invention is not particularly limited but is preferably 0.1 to 10 µm, more preferably 0.5 to 7.0 µm, and yet more preferably 1.0 to 5.0 µm. The average particle diameter is determined by dispersing a sample in a 0.1% aqueous sodium hexametaphosphate solution, ultrasonically treating the dispersed sample for 5 minutes, and then measuring the diameter by using "Coulter Multisizer 11" produced by Beckman Coulter, Inc.

These aluminum polyphosphates may be surface-treated or mixed with silica, a zinc compound, a magnesium compound, a calcium compound, or the like. The acidity can be controlled by surface-treating or mixing aluminum polyphosphates with these metal compounds.

The aluminum polyphosphate content is adequately selected according to the configuration of the nonaqueous electrolyte cell, the usage, and the type of the base resin. Typically, the aluminum polyphosphate content is preferably 1 to 33 parts by mass and more preferably 3 to 30 parts by mass relative to 100 parts by mass of the base resin. If the aluminum polyphosphate content is excessively high, the adhesion strength to the conductors tends to decrease and the sealing performance tends to deteriorate. When the aluminum polyphosphate content is less than 1 part by mass, aluminum polyphosphate does not sufficiently achieve the effects.

The thermal adhesive layer may contain, in addition to the base resin and the aluminum polyphosphate described above, various additives such as a flame retarder, a UV absorber, a light stabilizer, a heat stabilizer, a lubricant, and a coloring agent according to need. The content of these additives is preferably 30 mass % or less of the total of the resin composition.

A composition that contains a base resin, aluminum polyphosphate, and, if needed, additives is mixed by using a known mixer such as an open roll mixer, a pressure kneader, a single-screw mixer, or a twin-screw mixer and formed into a film-shape thermal adhesive layer by extrusion forming or the like. The thickness of the thermal adhesive layer 4 depends on the thickness of the lead conductors 3 but is usually preferably 30 to 200 µm.

The thermal adhesive layer 4 may be crosslinked by irradiation with an ionizing radiation such as an accelerated electron beam or a γ ray and used. Crosslinking enhances the heat resistance and prevents the decrease in adhesive strength at a high operation temperature and short-circuiting between the lead conductors 3 and the metal layer 5. The entire thermal adhesive layer 4 may be crosslinked or the thermal adhesive layer 4 may be formed to have a multilayer structure in which non-crosslinked layers and crosslinked layers are stacked.

The thermal adhesive layer 4 may be formed in advance to cover the lead conductor 3 in a portion corresponding the seal part or may be formed on the laminating film constituting the sealable container 2 in a portion that comes into contact with the lead conductor 3.

Figure 3:
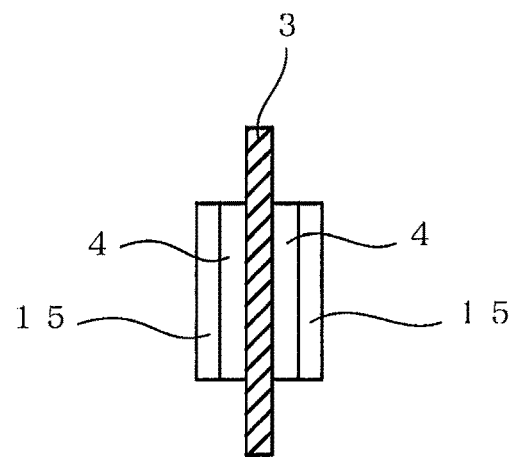
FIG. 3 is a partial cross-sectional view of a lead wire according to an embodiment of the present invention.

FIG. 3 shows the case where a portion (both sides) of the lead conductor 3 corresponding to the seal part is covered with a thermal adhesive film that serves as a thermal adhesive layer. The lead conductor covered with the thermal adhesive film such as this is also referred to as "lead wire". The lead wire is sometimes referred to as a tab lead.

Figure 4:
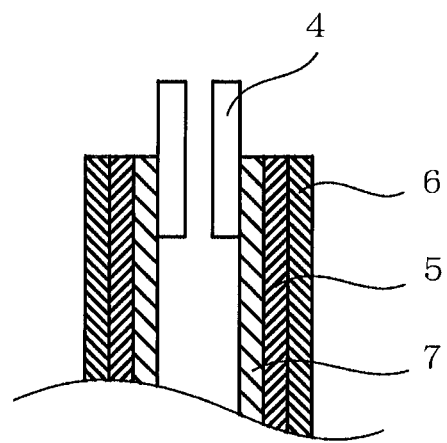
FIG. 4 is a partial cross-sectional view of a sealable container according to an embodiment of the present invention.

FIG. 4 shows the case where the thermal adhesive layer is formed on the sealable container in advance.

Figure 5:
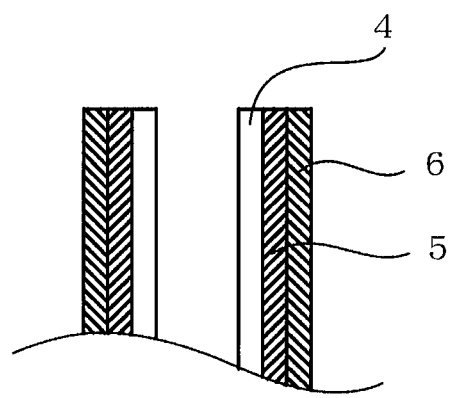
FIG. 5 is a partial cross-sectional view of a sealable container according to an embodiment of the present invention.
Figure 6:
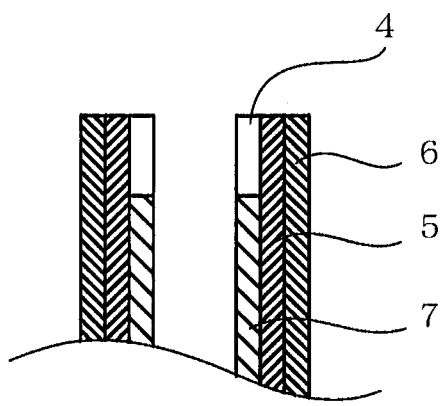
FIG. 6 is a partial cross-sectional view of a sealable container according to an embodiment of the present invention.

The nonaqueous electrolyte cell of the present invention is not limited to a cell in which a thermal adhesive layer is formed in the seal part for the lead conductor but also includes a cell in which the entire resin layer 7 is replaced with a thermal conductive layer 4 as shown in FIG. 5. Moreover, as shown in FIG. 6, a cell in which a portion (portion corresponding to the seal part) of the insulating resin layer 7 is replaced with a thermal adhesive layer 4 is also included.

In sealing (heat-sealing) the lead conductor and the sealable container, a thermal adhesive layer may be interposed between the lead conductor and the sealable container. In this case also, the thermal adhesive layer may have a multilayer structure.

According to such a nonaqueous electrolyte cell, the electrolyte resistance is enhanced, that is, separation between the lead conductor metal and the thermal adhesive layer in the seal part caused by corrosion of the lead conductor by hydrofluoric acid generated by reaction with moisture is suppressed, and the durability of the nonaqueous electrolyte cell is improved. Although the mechanism is not clear, it is presumed that because of the action of the aluminum polyphosphate contained in the thermal adhesive layer, a passivation film is formed on the metal surface of the lead conductor 3 and suppresses the corrosion by hydrofluoric acid generated by reaction with moisture.

Although a bag-shape nonaqueous electrolyte cell is used as an example in the description above, the nonaqueous electrolyte cell of the present invention is not limited to this. Although a nonaqueous electrolyte cell such as a lithium ion cell is used as an example in the description above, the electrical part of the present invention is not limited to the nonaqueous electrolyte cell and may be any other electrical part in which a seal part is required to achieve a high adhesive property to a conductor and high resistance to hydrofluoric acid.

EXAMPLES

The present invention will now be described in further detail by using examples that do not limit the scope of the present invention.

Measurement and Evaluation Methods (1) Initial Adhesive Strength

A lead wire was cut to a 10 mm width and the adhesive strength between a thermal adhesive layer and a lead conductor was measured by a 180° peel test. The tensile rate was 100 mm/min.

(2) Resistance to Hydrofluoric Acid

Ethylene carbonate (EC), diethyl carbonate (DEC), and dimethyl carbonate (DMC) were mixed at a 1:1:1 volume ratio, and an electrolytic solution dissolving 1.0 mol/L of lithium hexafluorophosphate ($LiPF_6$) as the electrolyte was prepared. Lead wires of Examples 1 to 3 were immersed in this electrolytic solution, the moisture concentration in the electrolytic solution was adjusted to 900 to 1000 ppm, and the immersed lead wires were left in a thermostat at 65° C. for 2 weeks. Whether separation occurred between the lead conductor and the insulating film serving as the thermal adhesive layer was then observed with naked eye.

Preparation of Lead Wire

One of aluminum dihydrogen tripolyphosphates (aluminum triphosphates) 1 to 3 in an amount shown in Table 1 was added to maleic anhydride-modified polypropylene having a thickness of 50 μm, and the resulting mixture was melt kneaded in a twin-screw mixer and melt extruded through a T die to prepare a film having a thickness of 100 mm.

Nickel-plated copper having a thickness of 0.1 mm, a width of 20 mm, and a length of 40 mm was prepared as a lead conductor for a negative electrode. Both sides of the lead conductor were covered with the film prepared as above and pressed at 200° C. for 5 seconds to prepare a lead wire in which the film served as a thermal adhesive layer.

For the lead wire prepared, the initial adhesive strength and the resistance to hydrofluoric acid were measured and evaluated according to the evaluation methods above. The results are also shown in Table 1.

The aluminum dihydrogen tripolyphosphates 1 to 3 used were as follows:
Aluminum dihydrogen tripolyphosphate 1: "K-WHITE #105" (average particle diameter: 1.6 μm) produced by Tayca Corporation
Aluminum dihydrogen tripolyphosphate 2: "K-WHITE 0105" (average particle diameter: 2.3 μm) produced by Tayca Corporation
Aluminum dihydrogen tripolyphosphate 3: "K-FRESH #100P" (average particle diameter: 1.0 μm) produced by Tayca Corporation

TABLE I

| | | No. | | | | | |
|---|---|---|---|---|---|---|---|
| | | 1 | 2 | 3 | 4 | 5 | 6 |
| Composition of thermal adhesive layer | Acid-modified PP | 100 | 100 | 100 | 100 | 100 | 100 |
| | Al tripolyphosphate 1 | 5 | — | — | — | — | — |
| | Al tripolyphosphate 2 | — | 5 | 25 | — | — | 35 |
| | Al tripolyphosphate 3 | — | — | — | 5 | — | — |
| Evaluation | Initial adhesive strength | Breakage of material | Breakage of material | Breakage of material | Breakage of material | Breakage of material | 5 N/cm |
| | Resistance to hydrofluoric acid | Satisfactory | Satisfactory | Satisfactory | Satisfactory | Separated after 1 week | Not measured |

The lead wires Nos. 1 to 4 having thermal adhesive layers containing 5 to 25 parts by mass of aluminum dihydrogen tripolyphosphate had an initial adhesive strength of 10 N/cm or more and the thermal adhesive layers broke in the peel test (breakage of material). No separation was observed in the hydrofluoric acid resistance test and the resistance to hydrofluoric acid was satisfactory.

No. 5 is a sample that does not contain aluminum dihydrogen tripolyphosphate. Although the initial adhesive strength was satisfactory as with Nos. 1 to 4, separation was observed after one week in the hydrofluoric acid resistance test and thus the resistance to the hydrofluoric acid was unsatisfactory.

When 35 parts by mass of aluminum dihydrogen tripolyphosphate was contained (No. 6), the initial adhesive strength was as low as 5 N/cm and it was difficult to reliably obtain the adhesive property required for sealing. This shows that in order to reliably obtain high sealing performance and resistance to hydrofluoric acid by blending aluminum dihydrogen tripolyphosphate, it is preferable to use about 1 to 33 parts by mass of aluminum dihydrogen tripolyphosphate per 100 parts by mass of the resin component.

REFERENCE SIGNS LIST 1 nonaqueous electrolyte cell
2 sealable container
3 lead conductor
4 thermal adhesive layer
5 metal layer
6 resin layer
7 resin layer
8 laminating film
9 seal part
10 positive electrode collector
11 negative electrode collector
12 separator
13 nonaqueous electrolyte
15 other resin layer

The invention claimed is:

1. An electrical part comprising
a sealed container that includes a metal layer and a lead conductor that extends from inside of the sealed container to outside of the sealed container, the sealed container and the lead conductor having a heat-sealed part, the lead conductor being composed of nickel or a metal having a surface plated with nickel,
wherein, at least a part of the heat sealed part, a thermal adhesive layer containing aluminum polyphosphate is provided in a portion between the metal layer and the lead conductor so as to be in contact with the lead conductor.

2. The electrical part according to claim 1, wherein the thermal adhesive layer is composed of a resin composition containing 1 to 33 parts by mass of aluminum polyphosphate per 100 parts by mass of an acid modified polyolefin.

3. The electrical part according to claim 1, wherein the aluminum polyphosphate has an average particle diameter of 0.1 to 10 μm.

4. A nonaqueous electrolyte cell comprising a sealed container that includes a metal layer, a lead conductor that extends from inside of the sealed container to outside of the sealed container, an electrolyte sealed inside the sealed container, and an electrode sealed inside the sealed container and connected to an end of the lead conductor, the sealed container and the lead conductor having a heat-sealed part,
wherein, at least in part of the heat sealed part, a thermal adhesive layer containing aluminum polyphosphate is provided in a portion between the metal layer and the lead conductor so as to be in contact with the lead conductor, and the lead conductor is composed of nickel or a metal having a surface plated with nickel.

* * * * *